United States Patent
Chen et al.

(10) Patent No.: US 8,139,425 B2
(45) Date of Patent: *Mar. 20, 2012

(54) VOLTAGE REGULATION METHOD AND MEMORY APPLYING THEREOF

(75) Inventors: Han-Sung Chen, Hsinchu (TW); Tseng-Yi Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/943,372

(22) Filed: Nov. 10, 2010

(65) Prior Publication Data

US 2011/0058430 A1 Mar. 10, 2011

Related U.S. Application Data

(63) Continuation of application No. 12/350,381, filed on Jan. 8, 2009, now Pat. No. 7,859,917.

(51) Int. Cl.
*G11C 5/14* (2006.01)

(52) U.S. Cl. ......... 365/189.09; 365/189.05; 365/185.23; 365/236

(58) Field of Classification Search ............. 365/189.09, 365/189.05, 185.23, 236

See application file for complete search history.

(56) References Cited

U.S. PATENT DOCUMENTS

| | | | |
|---|---|---|---|
| 6,831,858 B2 | 12/2004 | Hirano et al. | |
| 7,859,917 B2 * | 12/2010 | Chen et al. | 365/189.09 |
| 2003/0151950 A1 | 8/2003 | Tamada et al. | |
| 2009/0003058 A1 | 1/2009 | Kang | |
| 2009/0129157 A1 | 5/2009 | Honda et al. | |
| 2009/0212776 A1 | 8/2009 | Kitagawa et al. | |

* cited by examiner

*Primary Examiner* — Tuan T Nguyen
*Assistant Examiner* — Toan Le
(74) *Attorney, Agent, or Firm* — Thomas|Kayden

(57) ABSTRACT

A voltage regulating method applied to a memory to regulate a word line voltage corresponding to a set of memory cells of the memory includes the following steps. Firstly, a first value, which is for indicating an amount of data having a specific data value in a set of written data, is counted, wherein the set of written data is written into the set of memory cells. Next, a second value, which is for indicating an amount of data having the specific data value in a set of read data, is counted, wherein the set of read data is obtained by reading the set of written data. Then, a regulating voltage is determined according to a difference between the first and second values. After that, the word line voltage is regulated to be a sum of the word line voltage and the regulating voltage.

14 Claims, 4 Drawing Sheets

| |Nb1-Nb2| | 0 | 5 | 10 | 15 | 20 | 25 | 30 | 35 | 40 | 45 | 50 | ··· | 100 |
|---|---|---|---|---|---|---|---|---|---|---|---|---|---|
| Step | 0 | 1 | 1 | 2 | 2 | 3 | 3 | 4 | 4 | 5 | 5 | ··· | 10 |

VOLTAGE REGULATION METHOD AND MEMORY APPLYING THEREOF

This application is a continuation application of application Ser. No. 12/350,381, filed on Jan. 8, 2009, now U.S. Pat. No. 7,859,917, the contents of which are incorporated herein by reference.

BACKGROUND OF THE INVENTION

1. Field of the Invention

The invention relates in general to a voltage regulating method, and more particularly to a voltage regulating method for regulating a word line voltage in a memory.

2. Description of the Related Art

In the modern age, in which the technology changes with each passing day, non-volatile memories, such as flash memories, are widely used in various electronic products. Conventionally, the threshold voltage of the flash memory cell and the data stored therein are determined by controlling the number of electrons trapped by a floating gate or a nitride layer of the memory cell.

FIG. 1 (Prior Art) is a distribution graph showing a threshold voltage of a memory cell in a conventional flash memory. As shown in FIG. 1, for example, the memory cells of the flash memory may be substantially divided into group distributions G_0 and G_1. Each memory cell in the group distribution G_1 has the higher threshold voltage, and correspondingly stores the data value of 0, for example. Each memory cell in the group distribution G_1 has the lower threshold voltage and correspondingly stores the data value of 0, for example. The corresponding lowest threshold voltage in the group distribution G_1 has the voltage level BV0, for example, and the corresponding highest threshold voltage in the group distribution G_0 has the voltage level BV1, for example.

In the modern technology, the word line voltage having the level ranging between the voltages BV0 and BV1 is provided to drive the to-be-read memory cell in the flash memory. The voltage difference between the voltages BV0 and BV1 is defined as a sensing window, for example.

However, the size of the sensing window is correspondingly reduced with the update of the technology of the flash memory. Thus, it is an important direction in the industry to design a method capable of effectively regulating a level of a word line voltage.

SUMMARY OF THE INVENTION

The invention is directed to a voltage regulating method for regulating a word line voltage according to a difference between the written data to be written into a specific memory, and the read data read from the memory. Compared with the conventional word line voltage regulating method, the voltage regulating method of the invention has the advantage of effectively finding the suitable level of the word line voltage.

According to a first aspect of the present invention, a voltage regulating method applied to a memory to regulate a word line voltage corresponding to a set of memory cells of the memory is provided. The voltage regulating method comprises the following steps. Firstly, a first value, which is for indicating a data amount of data having a specific data value in a set of written data, is counted, wherein the set of written data is written into the set of memory cells. Next, a second value, which is for indicating a data amount of data having the specific data value in a set of read data, is counted, wherein the set of read data is obtained by reading the set of written data. Then, a regulating adjustment (or delta) voltage is determined according to a difference between the first and second values. After that, the word line voltage is regulated to be a sum of the previous word line voltage and the regulating adjustment (or delta) voltage.

According to a second aspect of the present invention, a memory is provided. The memory comprises a word line driver, a memory block, an account data memory block, a counter, and a voltage regulator. The word line driver provides a word line voltage. The memory block comprises a set of memory cells for storing a set of written data, wherein the set of written data in the set of memory cells is read in response to the word line voltage so that a set of read data is generated. The count data memory block stores a first value, which corresponds to a data amount of data having a specific data value in the written data. The counter counts a data amount of data having the specific data value in the set of read data, and thus generates a second value. The voltage regulator determines a regulating voltage according to the first and second values, and provides the regulating voltage to the word line driver to regulate the word line voltage to be a sum of the word line voltage and the regulating voltage.

The invention will become apparent from the following detailed description of the preferred but non-limiting embodiments. The following description is made with reference to the accompanying drawings.

DETAILED DESCRIPTION OF THE INVENTION

The voltage regulating method of this embodiment obtains the regulating voltage information of regulating the word line voltage according to the data amount of data having the specific data value in the written data written into a set of memory cells and the data amount of data having the specific data value in the read data obtained by reading the written data recorded in the set of memory cells.

Figure 1:
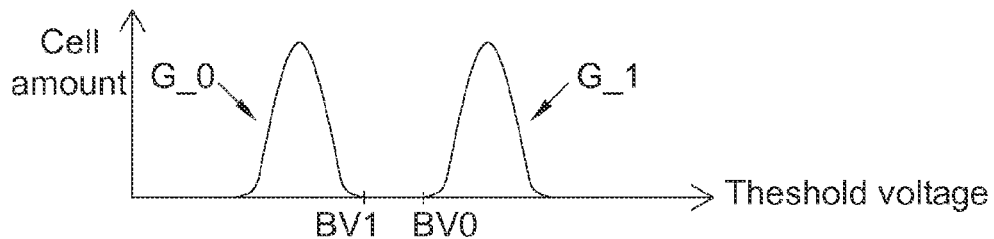
FIG. 1 (Prior Art) is a distribution graph showing a threshold voltage of a memory cell in a conventional flash memory.
Figure 2:
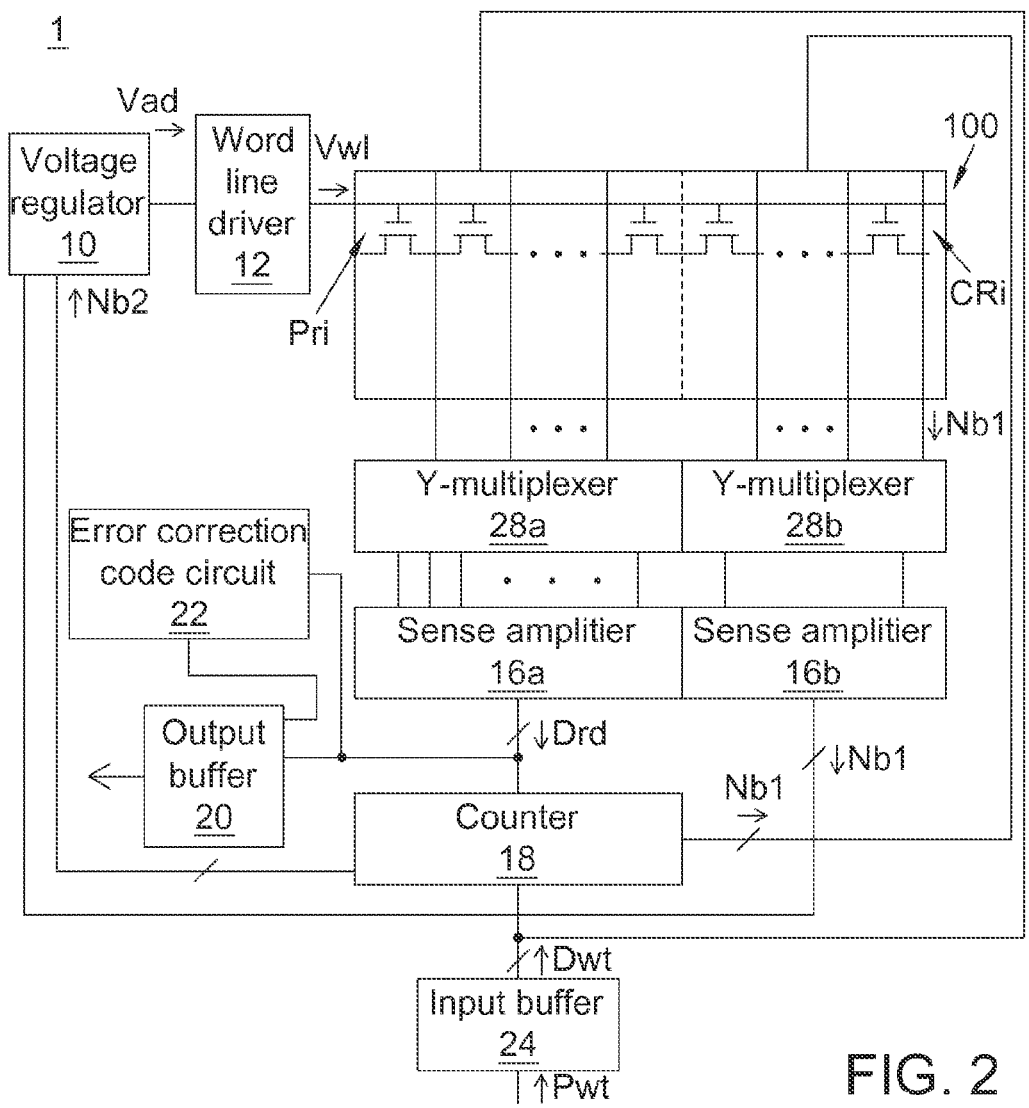
FIG. 2 is a block diagram showing a memory according to an embodiment of the invention.

FIG. 2 is a block diagram showing a memory 1 according to an embodiment of the invention. Referring to FIG. 2, the memory 1 includes a memory array 100, a voltage regulator 10, a word line driver 12, column multiplexers (Y-multiplexers) 28a and 28b, sense amplifiers 16a and 16b and a counter 18.

The memory array 100 includes M pages and M count data memory blocks corresponding to the M memory cell rows. Each memory cell row contains a few specific numbers of pages, for example, wherein M is a natural number greater than 1. Because the access operations to each page and each count data memory block of the associated page in the memory array 100 are similar to each other, the access operations to the $i^{th}$ page, Pri, and the corresponding $i^{th}$ count data memory block, Cri, in the memory array 100 will be described as an example, wherein "i" is a natural number smaller than or equal to M.

Page Pri includes N memory cells for storing a set of written data Dwt, wherein N is a natural number greater than 1. For example, N is equal to 1024, and each memory cell stores one bit datum. Thus, the written data Dwt includes 1024 sets of bit data. Though only the situation that each memory cell stores one bit datum is cited as an example, the memory cells of the memory array 100 are not limited thereto. In other example, each of the memory cells of the memory array 100 can also store 2 bit data (4-level MLC) or more than 2 bit data. For another embodiment not described herein, each memory cell might store 2 bit data (4-Level MLC) or more than 2 bit.

The count data memory block Cri stores a value Nb1 corresponding to the data amount of the data having the specific data value in the written data Dwt. For example, the count data memory block Cri includes 10 memory cells for storing a 10-bit value, which corresponds to the data amount of the data having the specific data value (e.g., the value 0) in the written data Dwt. If the data amount of the data having the specific data value in the written data Dwt is equal to one half of the total data amount thereof, then the value Nb1 is $(1000000000)_2$.

The word line driver 12 provides a word line voltage Vwl to a memory row where the page Pri is accessed and the count data memory block Cri. N memory cells in the page Pri and 10 memory cells in the count data memory block Cri turn on in response to the word line voltage Vwl. Thus, the written data Dwt stored in the page Pri is read by the sense amplifier 16a via the column multiplexer 28a so that a set of read data Drd is generated. The value Nb1 stored in the count data memory block Cri is correspondingly read by the sense amplifier 16b via the column multiplexer 28b. For example, the word line voltage Vwl has the level VL1.

The counter 18 counts the data amount of data having the specific data value in the set of read data Drd and thus generates the value Nb2 by way of calculation.

The voltage regulator 10 performs the calculation according to the values Nb1 and Nb2 to determine a adjustment (or delta) voltage and thereafter a new word line voltage Vwl is generated which would be the sum of the word line voltage (with the first level) and the regulating voltage.

Figure 3:
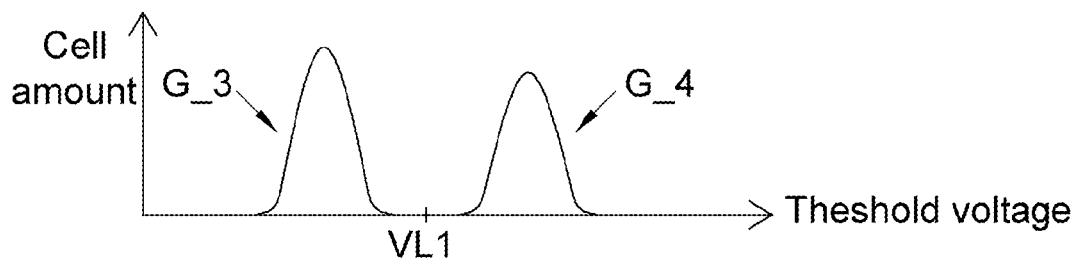
FIG. 3 is a distribution graph showing a threshold voltage of a memory cell in a memory array according to the embodiment of the invention.

More specifically, the voltage regulator 10 determines the polarity and the value of the regulating adjustment voltage according to the relationship between the values Nb1 and Nb2. For example, if the values Nb1 and Nb2 are the same, it represents that the data amounts of the data having the specific data value in the written data Dwt written into the memory block Cri and the read data read from the page Pri are the same. In this case, it represents that the level of the word line voltage Vwl needs not to be regulated so that the data in the page Pri can be correctly read, as shown in FIG. 3. The distributions G_3 and G_4 respectively show the distribution of the memory cells with the low threshold voltage (i.e., the memory cells storing the data with the value of 1) and the distribution of the memory cells with the high threshold voltage (i.e., the memory cells storing the data with the value of 0).

Figure 4:
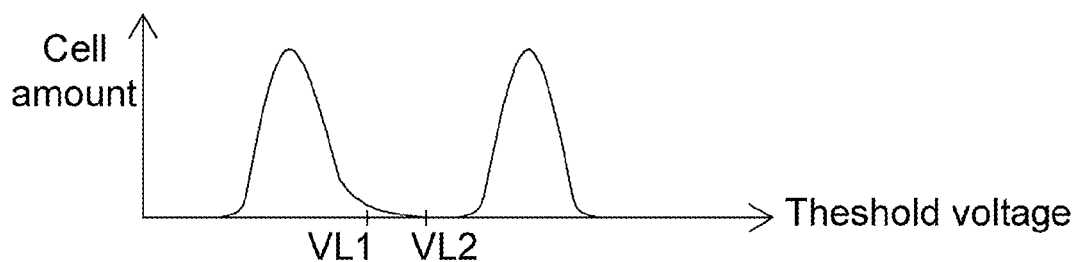
FIG. 4 is another distribution graph showing the threshold voltage of the memory cell in the memory array according to the embodiment of the invention.

In another example, the value Nb1 is smaller than the value Nb2. Thus, it represents that the data amount of the data having the specific data value in the written data Dwt written into the memory block Cri is smaller than the data amount of the data having the predetermined value in the read data read from the page Pri. In this case, if the data is read according to the current word line voltage Vwl (having the level VL1), the read values of some memory cells storing the data values of 1 are misjudged as the data values of 0, as shown in FIG. 4. In other words, when it is obtained that the value Nb1 is smaller than the value Nb2, it represents that the level of the word line voltage Vwl needs to be correspondingly increased to, for example, the voltage level VL2, and that the regulating voltage provided by the voltage regulator 10 has the positive polarity.

Figure 5:
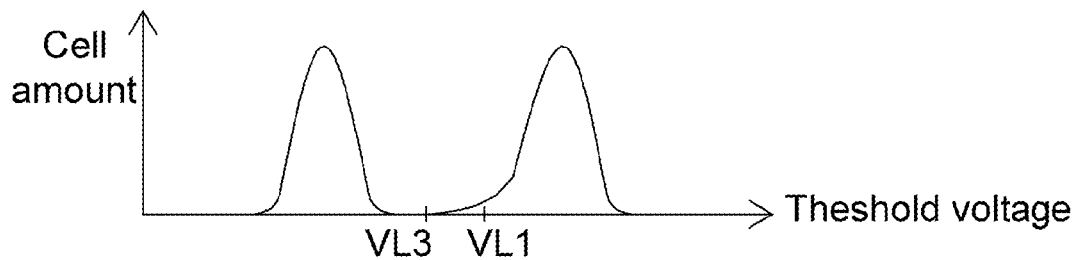
FIG. 5 is still another distribution graph showing the threshold voltage of the memory cell in the memory array according to the embodiment of the invention.

Oppositely, in still another example, the value Nb1 is greater than the value Nb2. At this time, the distribution graph corresponding to the threshold voltage of the memory cell is shown in FIG. 5. According to the example of FIG. 4, it is derived that, when it is obtained that the value Nb1 is greater than the value Nb2, the level of the word line voltage needs to be correspondingly reduced to, for example, the voltage level VL3, and that the regulating voltage provided by the voltage regulator 10 has the negative polarity.

Figures 6, 7:
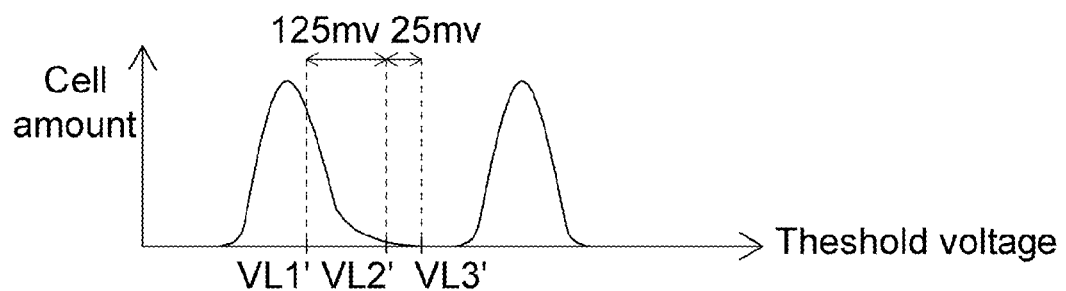
FIG. 6 is a schematic illustration showing a reference lookup table for a voltage regulator 10 according to the embodiment of the invention.
FIG. 7 is a distribution graph showing a voltage regulating method according to the embodiment of the invention.

The voltage regulator 10 further looks up the level of the regulating voltage via, for example, the lookup table. For example, the voltage regulator 10 stores the lookup table of the difference between the values Nb1 and Nb2 corresponding to the level of the regulating voltage, as shown in FIG. 6.

In this example, the step size voltage of the regulating adjustment voltage is equal to 25 millivolts (mV). When the difference between the values Nb1 and Nb2 is greater than 0 but smaller than 10, the corresponding regulating voltage size is equal to one step size voltage (25 mV); and when the difference between the values Nb1 and Nb2 is greater than 10 but smaller than 20, the corresponding regulating voltage size is equal to two step size voltages (i.e., 50 mV). The voltage regulator 10 can obtain the voltage size of the regulating voltage according to the values Nb1 and Nb2 and according to the relationship between the step size voltage and the difference between the values Nb1 and Nb2, wherein the relationship is stored in the lookup table. Thus, the voltage regulator 10 can generate the corresponding regulating adjustment voltage according to the voltage size and the polarity of the regulating voltage via the operation.

The memory 1 further includes an input buffer 24 for receiving the written data Dwt during the writing operation. The input buffer 24 further provides the temporarily stored written data Dwt to the counter 18 to calculate the value Nb1, which corresponds to the data amount of data having the specific data value in the written data Dwt.

The memory 1 further includes an error correction code (ECC) circuit 22 and an output buffer 20. The output buffer 20 receives and temporarily stores the read data Drd provided by the sense amplifier 16a. The ECC circuit 22 receives the output data Drd provided by the sense amplifier 16a, and performs an error correction operation according to the output data Drd to generate ECC information Secc. The ECC information Secc includes the information of the number of bits having the error data value in the output data Drd. The ECC circuit 22 further provides the ECC information Secc to the output buffer 20 so as to perform the error correction operation on the read data Drd.

In an example, the ECC circuit 22 further determines whether the number of bits having the error data value is smaller than or equal to an ECC correctable threshold so as to determine whether the read data Drd can be effectively corrected. When number of bits having the error data value is smaller than or equal to the ECC correctable threshold, the ECC circuit 22 directly provides the corrected read data.

When the number of bits having the error data value is greater than the ECC correctable threshold, the ECC circuit 22 triggers an event indicating that the word line voltage should be readjusted. Thus, up-mentioned operation is re-executed for adjusting the word line voltage.

For example, the ECC correctable threshold is 4. Referring to FIG. 7, an illustration of the word-line voltage adjustment is shown. In an operation example, the voltage regulator 10 determines that the value Nb1 is smaller than the value Nb2 by 50. Thus, the based on FIG. 6, a regulating voltage with 5 steps of voltage (that is 125 mV) is determined by the voltage regulator 10 for adjusting the word-line voltage from a level VL1' to a level VL2'.

After the regulated operation, the ECC circuit 22 determines that the number of bits having the error data value is 8, which is greater than the ECC correctable threshold 4. Thus, the up-mentioned operation is re-executed, and the voltage regulator 10 determines that the value Nb1 is smaller than the value Nb1 by 4. The voltage regulator 10 accordingly determines a regulating voltage with 1 step of voltage (that is 25 mV) for adjusting the word-line voltage from level VL2' to VL3'.

After the second regulated operation, the ECC circuit 22 determines that the number of bits having the error data value is 3, which is smaller than the ECC correctable threshold 4. Thus, the ECC circuit 22 can effectively correct and output the read data Drd.

Figure 8A:
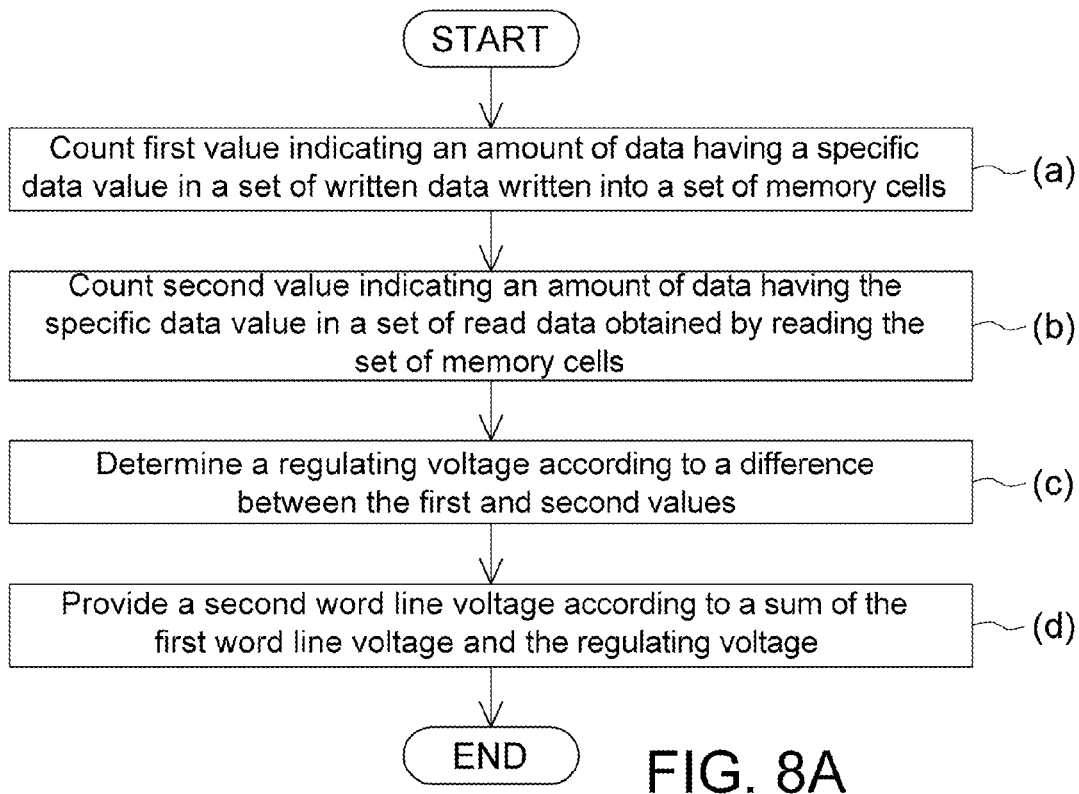
FIG. 8A and FIG. 8B are partial flow charts showing a voltage regulating method according to the embodiment of the invention.
Figure 8B:
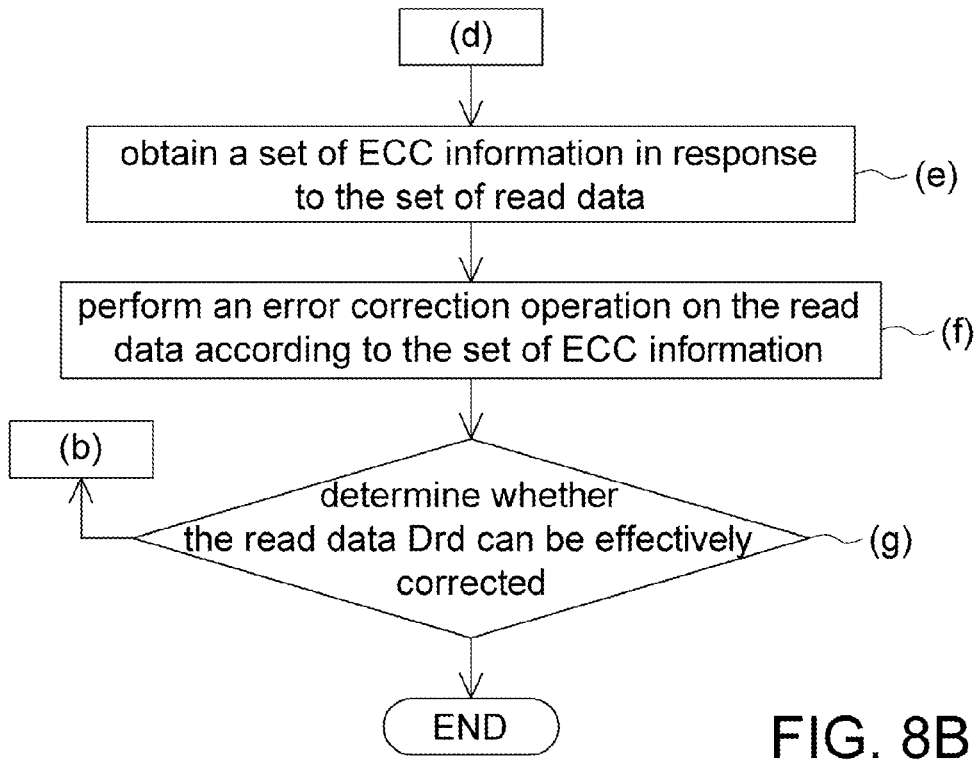

FIG. 8A and FIG. 8B are partial flow charts showing a voltage regulating method according to the embodiment of the invention. The detailed steps of the voltage regulating method according to this embodiment have been described hereinabove, so detailed descriptions thereof will be omitted.

In this illustrative embodiment, one data page corresponds to one memory cell row, and 1024 sets of written data are stored. However, the invention is not limited thereto. In this illustrative embodiment, the specific data value is equal to 0. However, the specific data value is not limited thereto, and may also be equal to the value of 1.

The voltage regulating method of this embodiment obtains the regulating voltage information of regulating the word line voltage according to the data amount of data having the specific data value in the written data written into a set of memory cells, and the data amount of data having the specific data value in the read data obtained by reading the written data recorded in the set of memory cells so that the level of the word line voltage can be regulated. Thus, compared with the conventional word line voltage regulating method, the voltage regulating method of the invention has the advantage of effectively finding the suitable level of the word line voltage.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An operating method for a plurality of memory cells comprising:
    counting an amount of data that will be written into the plurality of memory cells;
    reading the plurality of memory cells to get an amount of written memory cells; and
    providing a word line regulating voltage according to the difference between the amount of data and the amount of written memory cells.

2. The operation method according to claim 1, wherein the step of counting the amount of data that will be written into the plurality of memory cells comprises:
    counting a first value indicating an amount of data having a specific data value in the data that will be written into the plurality of memory cells.

3. The operation method according to claim 2, wherein the step of reading the plurality of memory cells to get an amount of written memory cells comprises:
    counting a second value indicating an amount of data having the specific data value in data that are read from the plurality of memory cells, wherein the data that are read from the plurality of memory cells are obtained by reading the plurality of memory cells according to a first word line voltage.

4. The operation method according to claim 3, wherein the step of providing a word line regulating voltage comprises:
    determining the word line regulating voltage according to a difference between the first and second values; and
    providing a second word line voltage according to a sum of the first word line voltage and the word line regulating voltage to read the plurality of memory cells.

5. The method according to claim 4, wherein the step of determining the word line regulating voltage comprises:
    judging whether or not the first value is greater than the second value to determine a polarity of the word line regulating voltage.

6. The method according to claim 5, wherein the step of determining the word line regulating voltage further comprises:
    determining the word line regulating voltage by a lookup table according to the difference and the polarity of the word line regulating voltage.

7. The method according to claim 5, further comprising the steps of:
    obtaining a set of error correction code (ECC) information in response to the data that are read from the plurality of memory cells; and
    performing an error correction operation on the data that are read from the plurality of memory cells to output corrected read data according to the set of ECC information.

8. A memory, comprising:
    a memory block comprising a plurality of memory cells;
    a count data memory block for obtaining an amount of data that will be written into the plurality of memory cells;
    a counter for obtaining an amount of written memory cells according to read operations of the plurality of memory cells; and
    a voltage regulator for determining a word line regulating voltage according to a difference of the amount of data and the amount of written memory cells.

9. The memory according to claim 8, wherein the count data memory block stores a first value, which corresponds to the amount of data, with a specific data value, to be written into the plurality of memory cells.

10. The memory according to claim 9, wherein the counter counts the amount of the written memory cells storing the specific data value, and thus generating a second value.

11. The memory according to claim 10, wherein the voltage regulator judges a relationship between the first and second values to determine a polarity of the word line regulating voltage.

12. The memory according to claim 11, wherein:
the voltage regulator determines the word line regulating voltage by a lookup table of the difference and the polarity of the word line regulating voltage.

13. The memory according to claim 9, further comprising:
an input buffer for temporarily storing the data that will be written into the plurality of memory cells, wherein the input buffer further provides the data that will be written into the plurality of memory cells to the counter to count the amount of data having the specific data value in the data that will be written into the plurality of memory cells, and thus to obtain the first value, which is further recorded in the count data memory block.

14. The memory according to claim 8, further comprising:
an output buffer for temporarily storing read data obtained from the read operations; and
an error correction code (ECC) circuit for performing an error correction operation on the read data.

\* \* \* \* \*